(12) United States Patent
Yamane et al.

(10) Patent No.: US 8,956,791 B2
(45) Date of Patent: Feb. 17, 2015

(54) EXPOSURE TOLERANCE ESTIMATION METHOD AND METHOD FOR MANUFACTURING SEMICONDUCTOR DEVICE

(71) Applicant: Kabushiki Kaisha Toshiba, Minato-ku (JP)

(72) Inventors: Osamu Yamane, Kanagawa-ken (JP); Kazuyuki Masukawa, Kanagawa-ken (JP); Yasunobu Kai, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/027,353

(22) Filed: Sep. 16, 2013

(65) Prior Publication Data
US 2014/0287350 A1    Sep. 25, 2014

(30) Foreign Application Priority Data

Mar. 22, 2013 (JP) ................................. 2013-061137

(51) Int. Cl.
*G03F 7/20* (2006.01)
(52) U.S. Cl.
CPC .............. *G03F 7/20* (2013.01); *G03F 7/70625* (2013.01); *G03F 7/70641* (2013.01)
USPC .............................. 430/30; 430/311; 430/394
(58) Field of Classification Search
USPC ............................................ 430/30, 311, 394
See application file for complete search history.

(56) References Cited

U.S. PATENT DOCUMENTS

2004/0265713 A1    12/2004   Shiobara et al.
2010/0040987 A1    2/2010    Temchenko et al.

FOREIGN PATENT DOCUMENTS

JP          2012-43906          3/2012

OTHER PUBLICATIONS

Extended European Search Report issued Jul. 28, 2014 in Patent Application No. 13184534.9.
S. Postnikov, et al., "Critical dimension control in optical lithography", Microelectronic Engineering, vol. 69, No. 2-4, XP004456695, (Sep. 1, 2003), pp. 452-458.
A. Mahorowala, et al., "Meeting critical gate linewidth control needs at the 65 nm node", Proceedings of SPIE, vol. 6156, XP040221734, (Mar. 14, 2006), pp. 61560M-1 to 61560M-12.

*Primary Examiner* — Christopher Young
(74) *Attorney, Agent, or Firm* — Oblon, Spivak, McClelland, Maier & Neustadt, L.L.P.

(57) ABSTRACT

According to one embodiment, an exposure tolerance estimation method is disclosed. The method can include setting a plurality of regions along a first surface of a substrate. The method can form a plurality of patterns for estimation by performing exposure on each of the regions using at least three levels of exposure condition using an exposure mask. The method can measure dimensions of the patterns for estimation and find relationships between the exposure condition and the dimensions. The method can select a first region from the regions. In the first region, a first dimension of a first pattern for estimation formed by exposure using a first exposure condition of an intermediate level out of the at least three levels falls within a previously set range. In addition, the method can calculate an exposure tolerance from a relationship between the first exposure condition and the first dimension.

20 Claims, 15 Drawing Sheets

EXPOSURE TOLERANCE ESTIMATION METHOD AND METHOD FOR MANUFACTURING SEMICONDUCTOR DEVICE

CROSS-REFERENCE TO RELATED APPLICATIONS

This application is based upon and claims the benefit of priority from Japanese Patent Application No. 2013-061137, filed on Mar. 22, 2013; the entire contents of which are incorporated herein by reference.

FIELD

Embodiments described herein relate generally to an exposure torelance estimation method and a method for manufacturing a semiconductor device.

BACKGROUND

In photolithography used in manufacturing a semiconductor device etc., a difference occurs in the dimensions of a pattern on completion due to a difference in exposure conditions, even between exposures using the same mask pattern. The relationship between the exposure amount and the pattern dimensions is found beforehand, and an appropriate exposure amount at which desired pattern dimensions are obtained is determined when exposure is performed, for example. The robustness of the pattern dimensions against the change in exposure conditions is called an exposure tolerance. In photolithography, it is important to estimate the exposure tolerance with high reliability.

DETAILED DESCRIPTION

Figure 1:
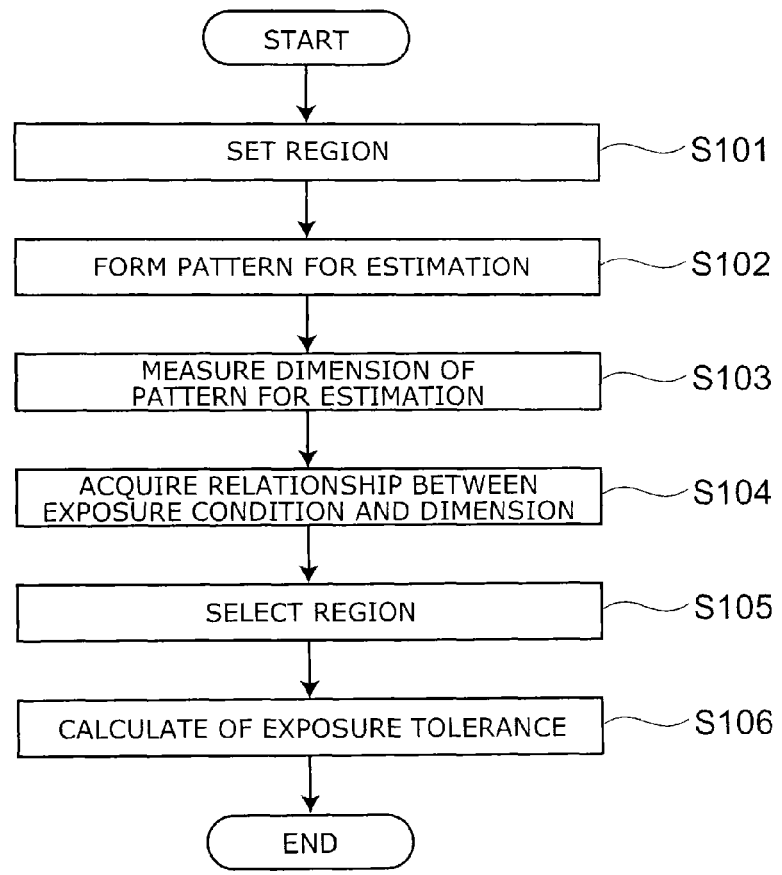
FIG. 1 is a flow chart illustrating an exposure tolerance estimation method according to a first embodiment.

According to one embodiment, an exposure tolerance estimation method is disclosed. The method can include setting a plurality of regions along a first surface of a substrate. The method can form a plurality of patterns for estimation by performing exposure on each of the regions using at least three levels of exposure condition using an exposure mask provided with a plurality of mask patterns having a same dimension. The method can measure dimensions of the patterns for estimation formed in the each of the regions and find relationships between the exposure condition and the dimensions for the each of the regions. The method can select a first region from the regions, in the first region a first dimension of a first pattern for estimation formed by exposure using a first exposure condition of an intermediate level out of the at least three levels falling within a previously set range. In addition the method can calculate an exposure tolerance from a relationship between the first exposure condition and the first dimension for the first selected region.

Various embodiments will be described hereinafter with reference to the accompanying drawings. In the following description, identical components are marked with the same reference numerals, and a description of components once described is omitted as appropriate.

First Embodiment

FIG. 1 is a flow chart illustrating an exposure tolerance estimation method according to a first embodiment.

As shown in FIG. 1, the exposure tolerance estimation method according to the first embodiment includes the setting of a region (step S101), the formation of a pattern for estimation (step S102), the dimensional measurement of the pattern for estimation (step S103), the acquisition of a relationship between the exposure condition and the dimension (step S104), the selection of a region (step S105), and the calculation of the exposure tolerance (step S106).

In the setting of a region shown in step S101, a plurality of regions along a first surface of a substrate are set.

Figure 2:
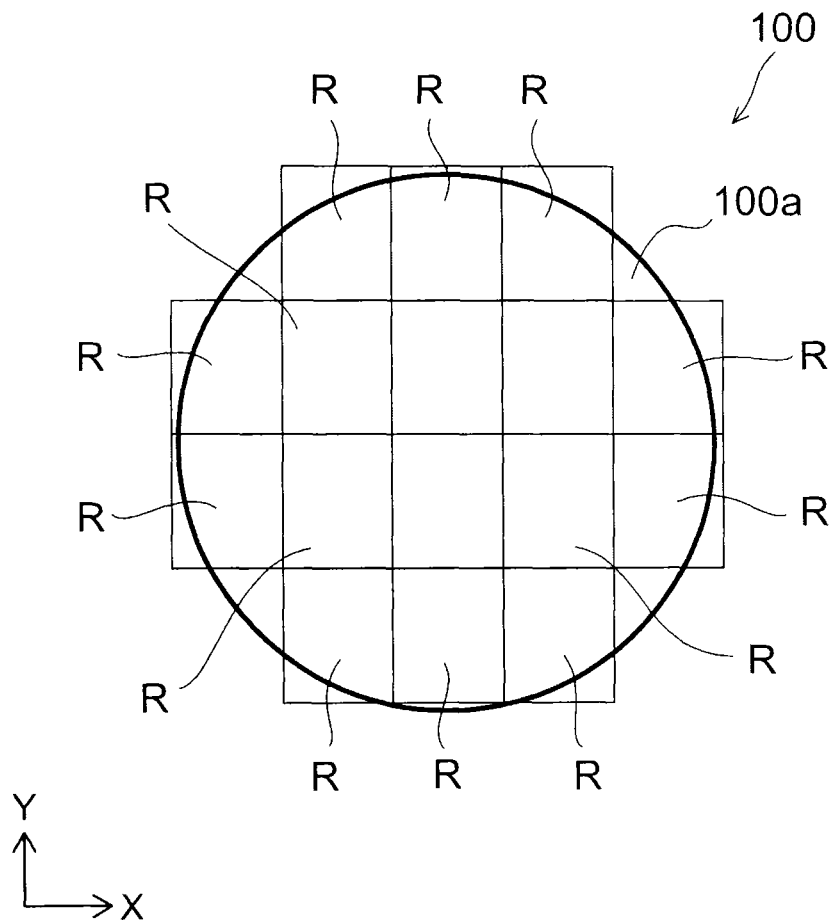
FIG. 2 is a schematic plan view illustrating the setting of a region.

FIG. 2 is a schematic plan view illustrating the setting of a region.

As shown in FIG. 2, for a substrate 100 that is an object on which a pattern is formed, a plurality of regions R are set on a first surface 100a of the substrate 100. The region R is set two or more in number. The substrate 100 is a semiconductor wafer, for example. In the example shown in FIG. 2, a plurality of regions R are set in each of a first direction along the first surface 100a (e.g. the X direction) and a second direction along the first surface 100a and orthogonal to the first direction (e.g. the Y direction). In the embodiment, one region R corresponds to the region of one exposure (one shot).

In the formation of a pattern for estimation shown in step S102, a plurality of patterns for estimation are formed on the first surface 100a of the substrate 100. The plurality of patterns for estimation are formed by exposure using an exposure mask in which a plurality of mask patterns having the same dimensions are provided. A plurality of patterns for estimation are formed in each of the plurality of regions R. The plurality of patterns for estimation are formed using at least three levels of exposure condition.

FIG. 3A to FIG. 4C are schematic plan views illustrating the formation of a pattern for estimation.

Figure 3A:
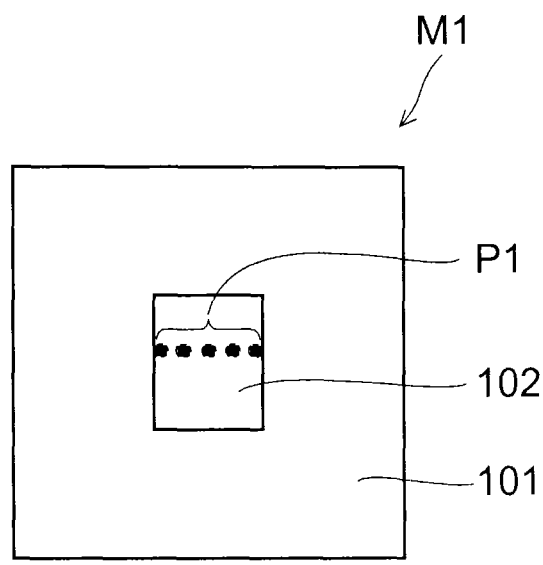
FIG. 3A to FIG. 4C are schematic plan views illustrating the formation of a pattern for estimation.

First, as shown in FIG. 3A, an exposure mask M1 (a reticle) for forming a pattern for estimation is prepared. The exposure mask M1 includes a light transmissive substrate 101 and a pattern region 102 provided on the substrate 101. A mask pattern P1 is formed in the pattern region 102 by means of a light transmissive material (e.g. chromium) and openings.

Figure 3B:
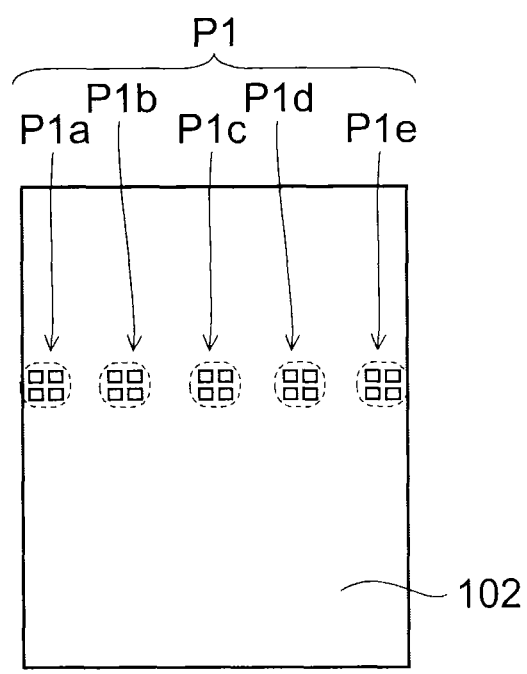

FIG. 3B shows an enlarged schematic plan view of the pattern region 102. A plurality of mask patterns P1a to P1e are provided in the pattern region 102. In the embodiment, the plurality of mask patterns P1a to P1e are collectively referred to as the mask pattern P1. In the example shown in FIG. 3B, the five mask patterns P1a, P1b, P1c, P1d, and P1e are shown. The five mask patterns P1a, P1b, P1c, P1d, and P1e have the same dimensions.

The mask pattern P1 is formed as either of a light blocking pattern and a light transmissive pattern in accordance with the characteristics (a positive type, a negative type) of a photosensitive resin (resist) used for exposure. The dimensions of the five mask patterns P1a, P1b, P1c, P1d, and P1e coincide with each other. The dimensions of the mask pattern P1 are the dimensions of a pattern to be estimated (a target size Tgt).

Using the exposure mask M1 in which such a mask pattern P1 is formed, exposure is performed on each of the plurality of regions R on the substrate 100 using at least three levels of exposure condition. In the embodiment, the case where the exposure amount is taken as the exposure condition and is changed is used as an example. In the embodiment, exposure with five levels of exposure amount is performed, for example. When exposure using the exposure mask M1 is performed on the region R corresponding to one shot, exposure with exposure amounts of levels different from one another is performed using the five mask patterns P1a, P1b, P1c, P1d, and P1e.

Figure 4A:
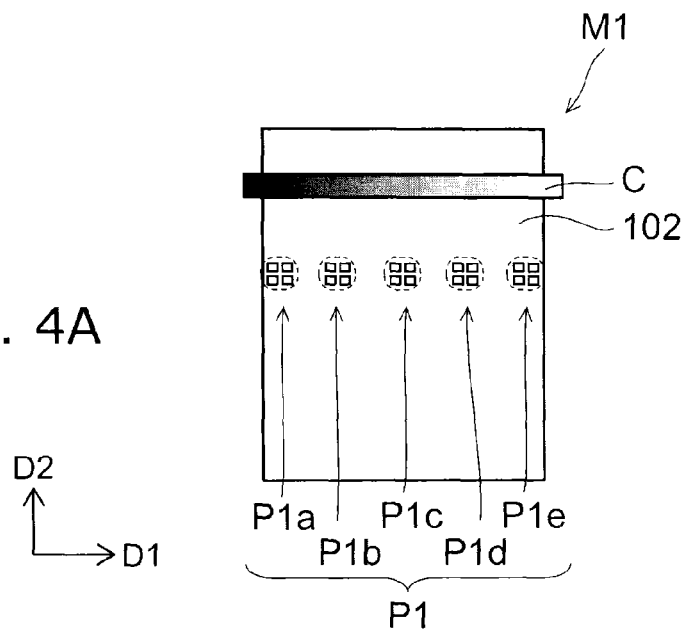

FIG. 4A illustrates a method in which exposure with different exposure amounts is performed in one shot. A rectangular light irradiation region C extending in the direction D1 in which the five mask patterns P1a, P1b, P1c, P1d, and P1e of the exposure mask M1 are aligned is set, for example.

The exposure amount in the light irradiation region C changes gradually in the direction D1. The exposure amount in the light irradiation region C may change step-by-step in the direction D1. The light irradiation region C is scanned in a direction D2 orthogonal to the direction D1 of the exposure mask M1. When the light irradiation region C and the mask pattern P1 overlap, the exposure of the five mask patterns P1a, P1b, P1c, P1d, and P1e is performed. The exposure amounts for the five mask patterns P1a, P1b P1c, P1d, and P1e are the exposure amounts in the positions in the direction D1 of the light irradiation region C overlapping with the five mask patterns P1a, P1b P1c, P1d, and P1e, respectively.

In the embodiment, exposure with exposure amounts of five levels different from one another is performed on the five mask patterns P1a, P1b P1c, P1d, and P1e, respectively, for example. The exposure amount based on the mask pattern P1a is denoted by ds1, the exposure amount based on the mask pattern P1b is denoted by ds2, the exposure amount based on the mask pattern P1c is denoted by ds3, the exposure amount based on the mask pattern P1d is denoted by ds4, and the exposure amount based on the mask pattern P1e is denoted by ds5. As an example, it is assumed that the exposure amount increases from the exposure amount ds1 to the exposure amount ds5.

To perform exposure using the exposure mask M1, a resist is applied onto the first surface 100a of the substrate 100, and then the exposure of the mask pattern P1 is performed on each of the plurality of regions R using the exposure mask M1. Exposure with exposure amounts different from one another using the five mask patterns P1a, P1b P1c, P1d, and P1e is performed on each of the plurality of regions R. After that, the resist is developed.

Figure 4B:
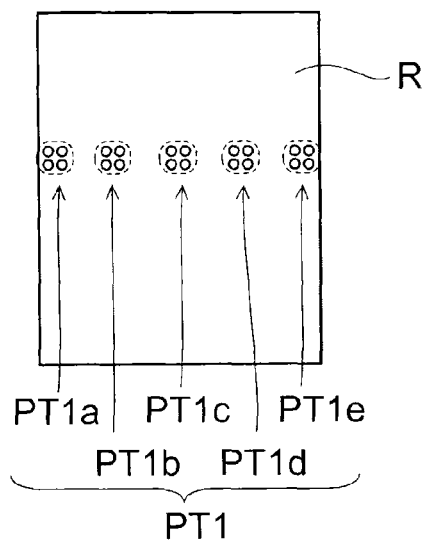
Figure 4C:
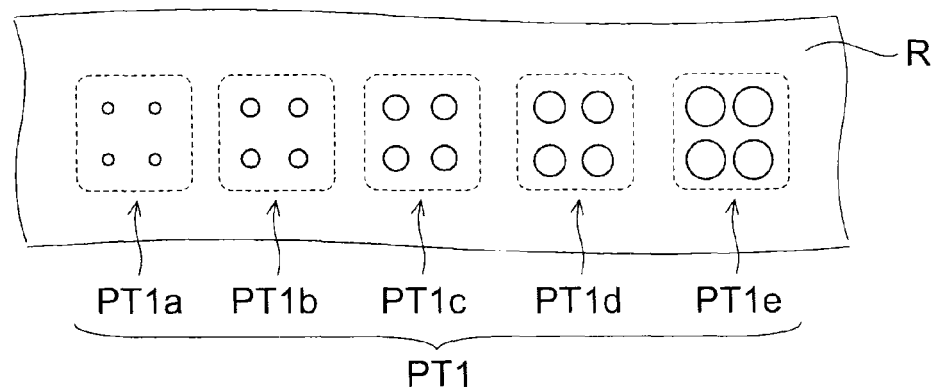

FIGS. 4B and 4C show an example of a pattern for estimation PT1 formed after the development. FIG. 4B shows an example of the pattern for estimation PT1 formed in one region R, and FIG. 4C shows an enlarged schematic plan view of a plurality of patterns for estimation PT1a to PT1e formed in one region R.

As shown in FIG. 4B, the pattern for estimation PT1 is formed in one region R. The pattern for estimation PT1 is a resist pattern, for example. The pattern for estimation PT1 may be a pattern obtained by etching the substrate 100 using a resist pattern as a mask.

The pattern for estimation PT1 includes the five patterns for estimation PT1a, PT1b, PT1c, PT1d, and PT1e formed by exposure using the five mask patterns P1a, P1b, P1c, P1d, and P1e, respectively. The dimensions of the five patterns for estimation PT1a, PT1b, PT1c, PT1d, and PT1e vary with the exposure amount. The dimensions of the pattern for estimation PT1 increase as the exposure amount increases, for example.

In the example shown in FIG. 4C, the dimensions of the pattern for estimation PT1a with a smallest exposure amount are smallest. On the other hand, the dimensions of the pattern for estimation PT1e with a largest exposure amount are largest.

Next, in the dimensional measurement of the pattern for estimation shown in step S103, the dimensions of the plurality of patterns for estimation PT1 formed in each of the plurality of regions R on the substrate 100 are measured. In the acquisition of a relationship between the exposure condition and the dimension shown in step S104, a relationship between the exposure condition and the dimension is found for each of the plurality of regions R.

Figure 5A:
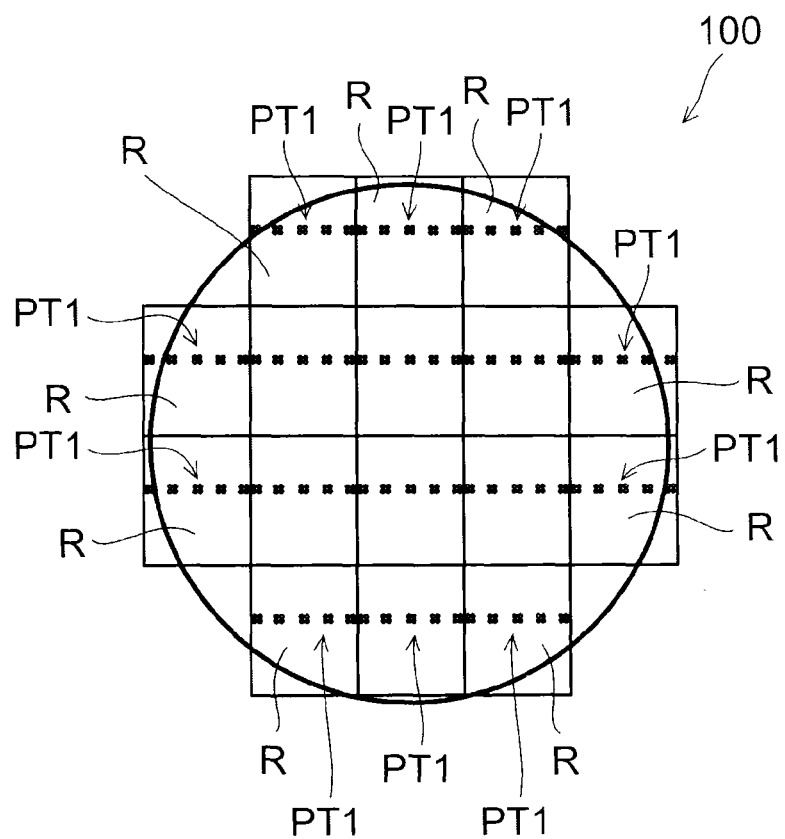
FIGS. 5A and 5B are diagrams illustrating the measurement of the dimension of the pattern for estimation.
Figure 5B:
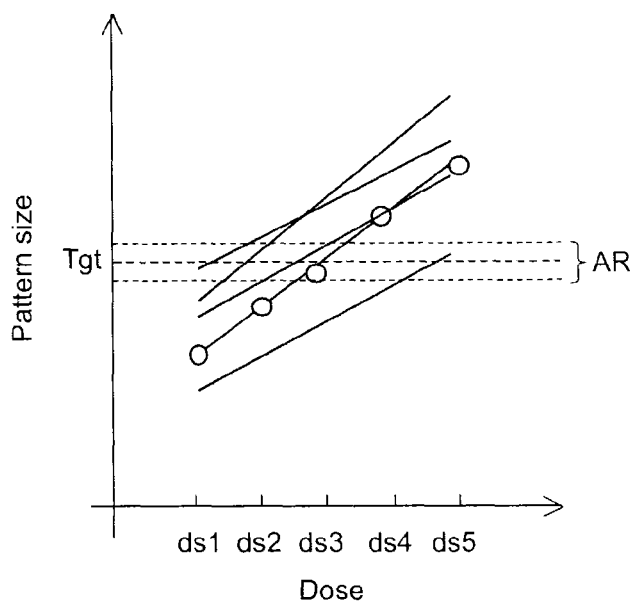

FIGS. 5A and 5B are diagrams illustrating the measurement of the dimension of the pattern for estimation.

FIG. 5A shows a schematic plan view illustrating a state where the pattern for estimation PT1 is formed in each region R of the substrate 100. FIG. 5B shows relationships between the exposure amount and the pattern dimension. Although the pattern for estimation PT1 is shown also on the outside of the substrate 100 in FIG. 5A for convenience of description, actually the pattern for estimation PT1 is not formed on the outside of the substrate 100.

As shown in FIG. 5A, the pattern for estimation PT1 (e.g. the five patterns for estimation PT1a, PT1b, PT1c, PT1d, and PT1e) is formed in each region R. The dimensions of the five patterns for estimation PT1a, PT1b, PT1c, PT1d, and PT1e are measured for each of the plurality of regions R. The dimension of the pattern for estimation PT1 is measured using a SEM (scanning electron microscope), for example. The dimension of the pattern for estimation PT1 is the length in the X direction or the Y direction, for example. The dimension may be the length in a direction parallel neither to the X direction nor to the Y direction. In the measurement of the dimension, the length in the same direction is measured for the five patterns for estimation PT1a, PT1b, PT1c, PT1d, and PT1e.

Each of the five patterns for estimation PT1a, PT1b, PT1c, PT1d, and PT1e corresponds to one of the five levels of exposure amounts. Thus, a relationship between the exposure amount and the pattern dimension is obtained using the measured dimension as the pattern dimension. As shown in FIG. 5B, a relationship between the exposure amount and the pattern dimension for each region R is obtained, with the exposure amount on the horizontal axis and the pattern dimension on the vertical axis, for example. At least three levels used in exposing the mask pattern P1 (e.g. the exposure amounts ds1, ds2, ds3, ds4, and ds5) are allotted to the exposure amounts. The relationship between the exposure amount and the pattern dimension is obtained as many as the plurality of regions R. For convenience of description, FIG. 5B shows the relationships for part of the plurality of regions R.

Next, in the selection of a region shown in step S105, a region R suitable for the estimation of the exposure tolerance is selected from the plurality of regions R. The selection is performed as follows. That is, a region R in which the dimension of the pattern for estimation PT1 formed by exposure using an exposure condition of an intermediate level out of the at least three levels falls within a previously set range is selected. The target dimension (target size Tgt) is included in the previously set range. In the selection, it is also possible to select a region R in which the dimension of the pattern for estimation PT1 formed by exposure using an exposure condition of an intermediate level is nearest to the target size Tgt.

In the embodiment, the exposure amount ds3, which is an intermediate level out of the five levels of exposure amounts ds1, ds2, ds3, ds4, and ds5, is taken as a reference. A region R in which the pattern dimension of the pattern for estimation PT1c formed with the exposure amount ds3 falls within the previously set range is selected.

Figure 6A:
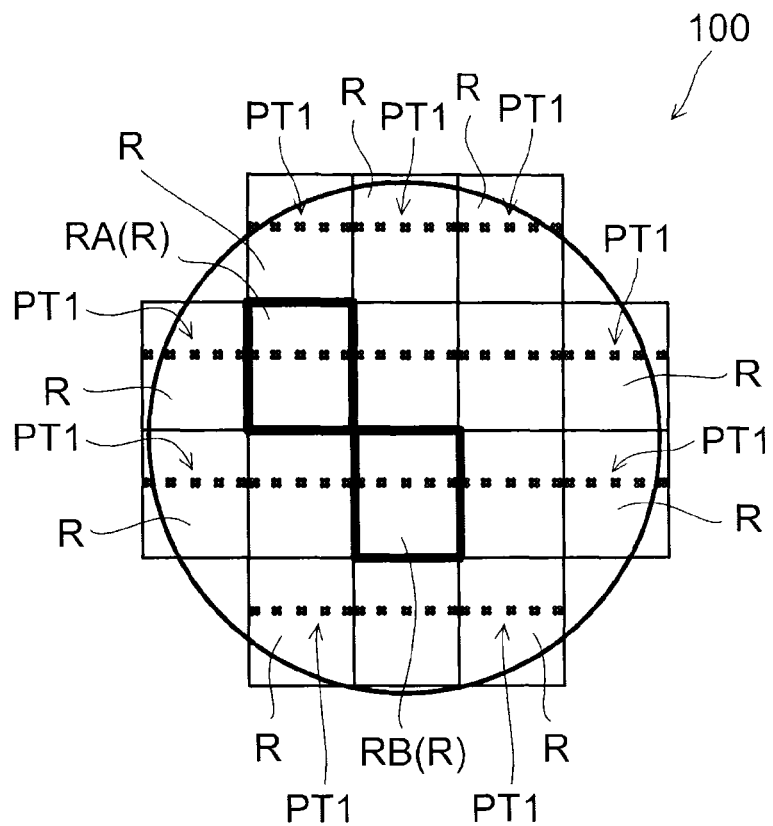
FIGS. 6A and 6B are schematic diagrams illustrating the selection of a region.
Figure 6B:
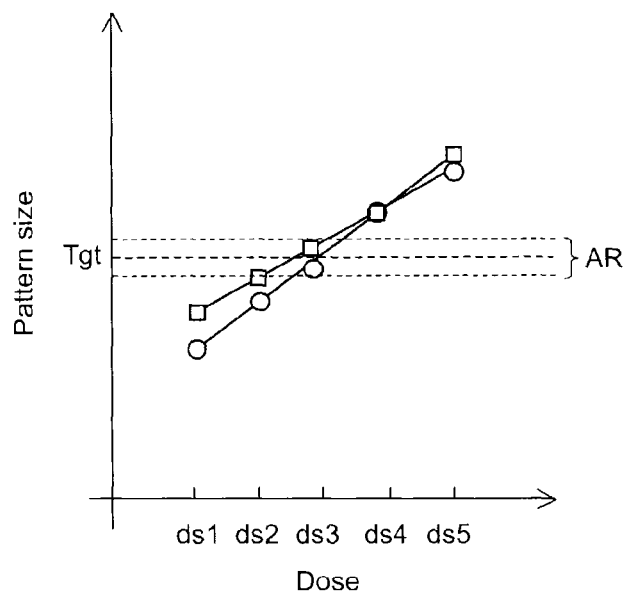

FIGS. 6A and 6B are schematic diagrams illustrating the selection of a region.

FIG. 6A shows selected regions R. FIG. 6B shows the relationships between the exposure amount and the pattern dimension for the selected regions R.

In the example shown in FIG. 6A, two regions RA and RB are selected from the plurality of regions R. As shown in FIG. 6B, the two regions RA and RB have relationships between the exposure amount and the pattern dimension in which the pattern dimension of the pattern for estimation PT1c formed with the exposure amount ds3 falls within a prescribed range AR with center at the target size Tgt.

Next, in the calculation of the exposure tolerance shown in step S106, the exposure tolerance is calculated from the relationship between the exposure condition and the pattern dimension for the selected region R. For example, the exposure tolerance is calculated from the relationships between the exposure amount and the pattern dimension of the two regions RA and RB previously selected. In the case where the number of selected regions R is one, the exposure tolerance is calculated from the relationship between the exposure amount and the pattern dimension of the region R.

Figure 7A:
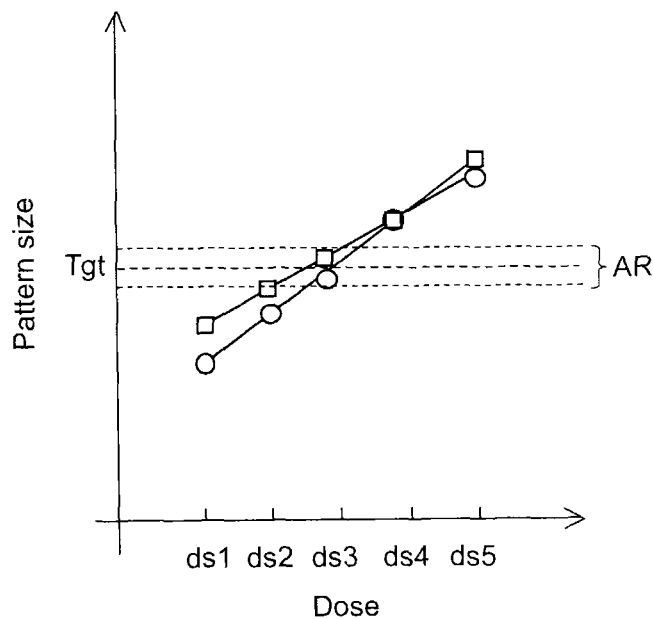
FIGS. 7A and 7B are diagrams illustrating the calculation of the exposure tolerance.
Figure 7B:
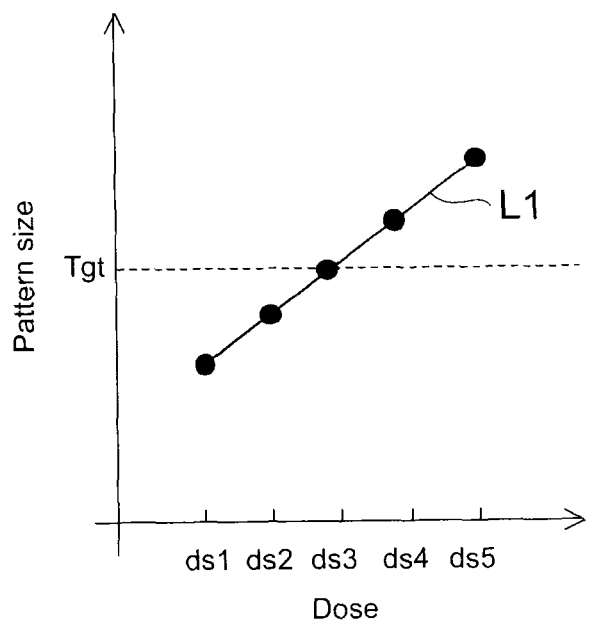

FIGS. 7A and 7B are diagrams illustrating the calculation of the exposure tolerance.

FIG. 7A shows the relationships between the exposure amount and the pattern dimension of the selected regions RA and RB. FIG. 7B shows the exposure tolerance calculated.

As shown in FIG. 7A, in the case where the plurality of regions RA and RB are selected, the relationships between the exposure amount and the pattern dimension of the regions are averaged. The exposure tolerance shown in FIG. 7B is obtained by averaging the relationships between the exposure amount and the pattern dimension of the two regions RA and RB shown in FIG. 7A.

To average them, the average value of the pattern dimension of the region RA and the pattern dimension of the region RB is found for the exposure amounts ds1, ds2, ds3, ds4, and ds5, for example. As shown in FIG. 7B, a straight line L1 is found by, for example, the least squares method using the average values of the pattern dimensions at the exposure amounts ds1, ds2, ds3, ds4, and ds5. The exposure tolerance is obtained by the gradient of the straight line L1, for example.

In the example mentioned above, the averaging of the relationships between the exposure amount and the pattern dimension in the two regions RA and RB is described. In the case where three or more regions are selected, the relationships between the exposure amount and the pattern dimension in the plurality of selected regions may be averaged similarly to the above. In the case where the number of selected regions is one, the straight line L1 may be found from the relationship between the exposure amount and the pattern dimension in the region.

In the exposure tolerance estimation method according to the embodiment described above, the reduction in reliability due to a variation in the plane of the substrate 100 of the dimensions of a pattern for estimation is suppressed. In the case where the region R is set to the size of one shot, a plurality of patterns for estimation PT1 are formed in one shot, for example. In regard to the plurality of patterns for estimation PT1 formed in one shot, the conditions other than the different levels of exposure condition may be equalized.

By forming the pattern for estimation PT1 in a plurality of regions R in one substrate 100, a region suitable for estimation can be selected and used as an object to be estimated of the exposure tolerance. A region in which the pattern dimension at an intermediate level of exposure amount is far from the target size Tgt may have been influenced by the in-plane variation of the substrate 100, for example. By excluding such a region from the object to be estimated, estimation of the exposure tolerance in which the influence of the in-plane variation is suppressed is made.

In the first embodiment described above, when the plurality of patterns for estimation PT1 are formed in each of the plurality of regions R, the image heights of the patterns in the exposure using the mask pattern P1 may be made the same. The plurality of mask patterns P1a to P1e are laid out in the pattern region 102 with consideration of the distance to the optical axis, the characteristics of the exposure lens, etc., for example. Thereby, the image heights of the plurality of patterns for estimation PT1a to PT1e formed by exposure using the plurality of mask patterns P1a to P1e can be made the same. Thus, the dimensional variation due to the image height of the pattern for estimation PT1 is suppressed, and estimation of the exposure tolerance with higher reliability is performed.

Second Embodiment

Figure 8:
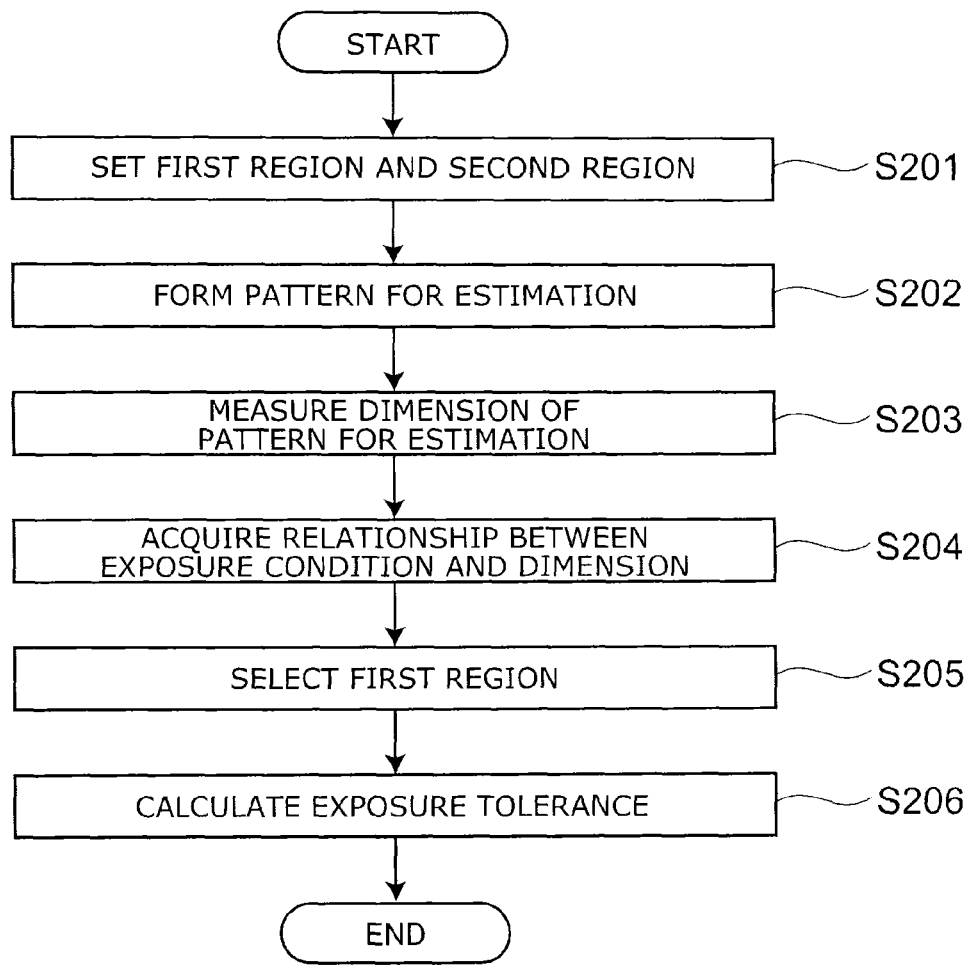
FIG. 8 is a flow chart illustrating an exposure tolerance estimation method according to a second embodiment.

FIG. 8 is a flow chart illustrating an exposure tolerance estimation method according to a second embodiment.

As shown in FIG. 8, the exposure tolerance estimation method according to the second embodiment includes the setting of a first region and a second region (step S201), the formation of a pattern for estimation (step S202), the dimensional measurement of the pattern for estimation (step S203), the acquisition of a relationship between the exposure condition and the dimension (step S204), the selection of a first region (step S205), and the calculation of the exposure tolerance (step S206).

In the setting of a first region and a second region shown in step S201, a plurality of first regions along a first surface of a substrate and a plurality of second regions provided in each of the plurality of first regions are set.

Figure 9A:
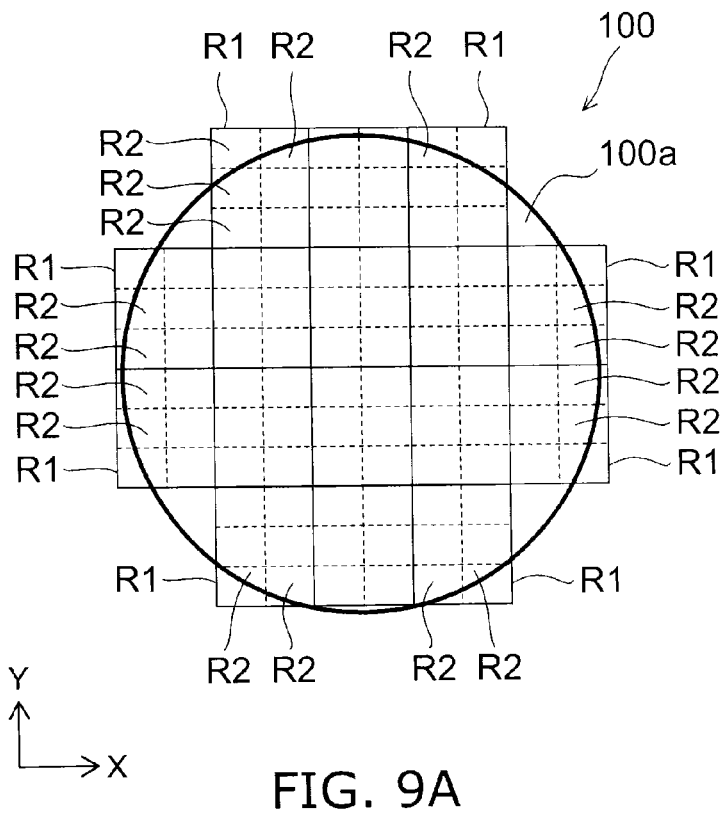
FIGS. 9A and 9B are schematic plan views illustrating the setting of a region.
Figure 9B:
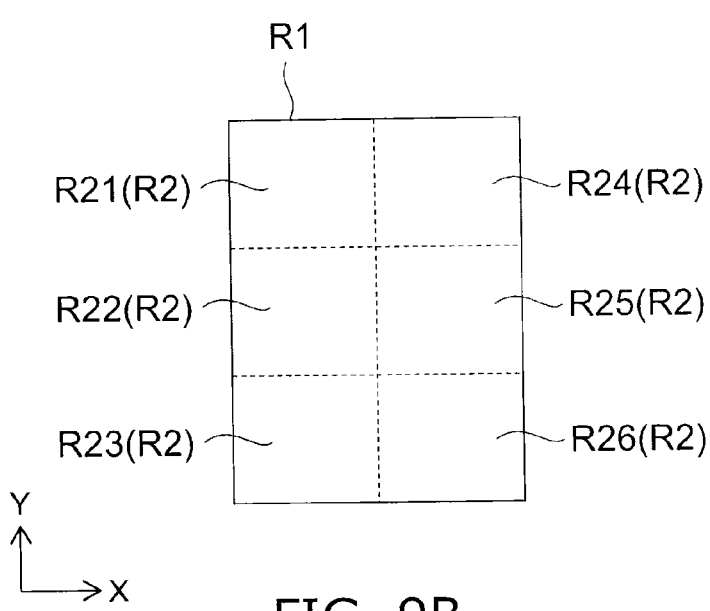

FIGS. 9A and 9B are schematic plan views illustrating the setting of a region.

FIG. 9A illustrates the setting of a region in the entire substrate 100, and FIG. 9B illustrates the setting of a second region R2 in a first region R1.

As shown in FIG. 9A, a plurality of first regions R1 are set on the first surface 100a of the substrate 100. The first region R1 is set two or more in number. In the example shown in FIG. 9A, a plurality of first regions R1 are set in each of the X direction and the Y direction. In the embodiment, one first region R1 corresponds to one shot.

A plurality of second regions R2 are provided in each of the plurality of first regions R1. As shown in FIG. 9B, a plurality of second regions R2 are set in one first region R1. In the example shown in FIG. 9B, a plurality of second regions R2 are set in each of the X direction and the Y direction in one first region R1. The second region R2 includes second regions R21 to R26, as an example. The second regions R21 to R26 are collectively referred to as the second region R2.

In the formation of a pattern for estimation shown in step S202, a plurality of patterns for estimation are formed on the first surface 100a of the substrate 100. One pattern for estimation is formed by exposure using an exposure mask provided with one mask pattern. One pattern for estimation is formed in each of the plurality of second regions R2. The plurality of patterns for estimation formed in each of the plurality of first regions R1 are formed using at least three levels of exposure condition. In the embodiment, the case where the exposure amount is taken as the exposure condition and is changed is used as an example.

FIG. 10A to FIG. 11B are schematic plan views illustrating the formation of a pattern for estimation.

Figure 10A:
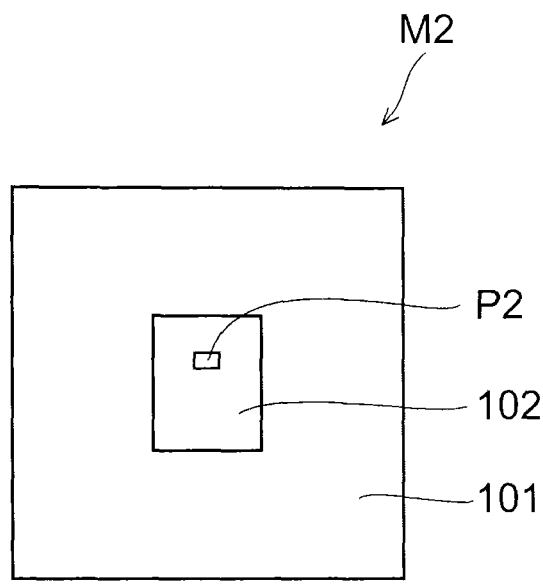
FIG. 10A to FIG. 11B are schematic plan views illustrating the formation of a pattern for estimation.

First, as shown in FIG. 10A, an exposure mask M2 (reticle) for forming a pattern for estimation is prepared. The exposure mask M2 includes the light transmissive substrate 101 and the pattern region 102 provided on the substrate 101. A mask pattern P2 is formed in the pattern region 102 by means of a light transmissive material (e.g. chromium) and an opening.

Figure 10B:
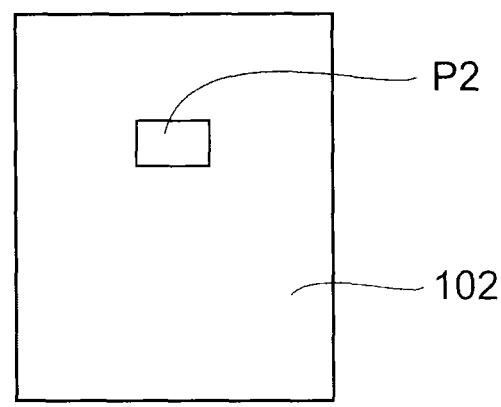

FIG. 10B shows an enlarged schematic plan view of the pattern region 102. One mask pattern P2 is provided in the pattern region 102. The mask pattern P2 is formed as either of a light blocking pattern and a light transmissive pattern in accordance with the characteristics (a positive type, a negative type) of a photosensitive resin (resist) used for exposure.

Using the exposure mask M2 in which such a mask pattern P2 is formed, exposure is performed on each of the plurality of second regions R2 on the substrate 100. In the embodiment, when the exposure of the pattern P2 is performed on each of the plurality of second regions R2 in one first region R1, exposure is performed with at least three levels of exposure amount for one first region R1.

Figure 11A:
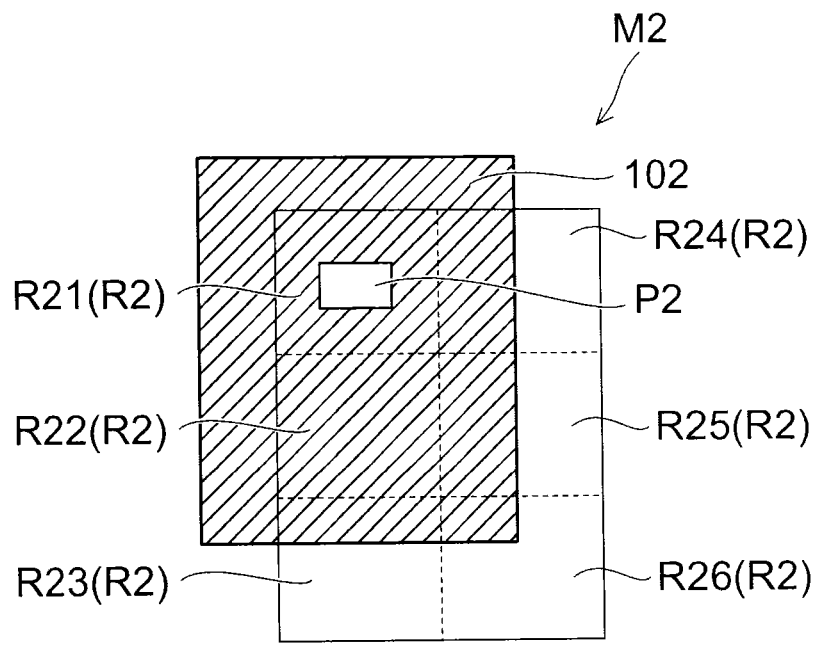
Figure 11B:
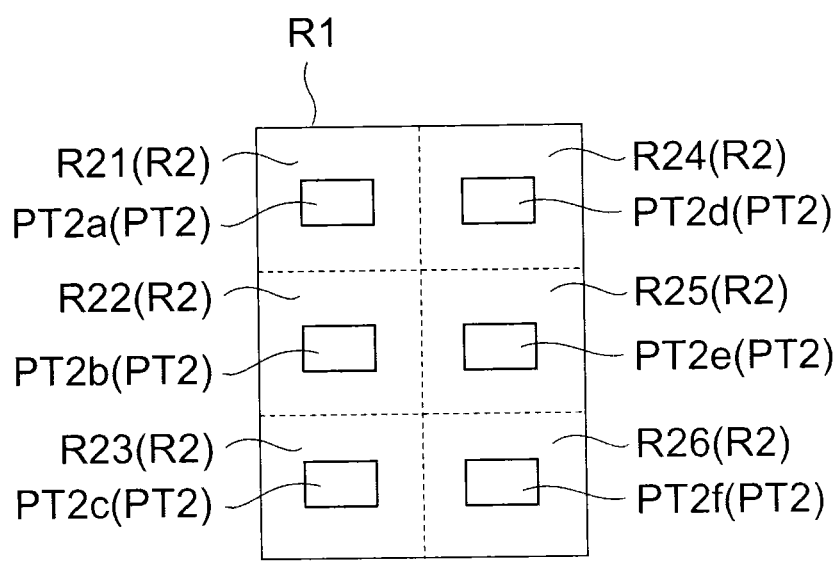

FIG. 11B shows the manner of one exposure using the exposure mask M2. When exposure using the mask pattern P2 of the exposure mask M2 is performed, exposure is performed on one second region R2 in one exposure. The example shown in FIG. 11A schematically shows a state where exposure is performed on the second region R21 out of the plurality of second regions R2 in one first region R1. In the exposure using the exposure mask M2, the portion other than the mask pattern P2 of the pattern region 102 is shielded from light. Exposure using the mask pattern P2 is performed on one second region R21 in one exposure. Exposure using the mask pattern P2 is similarly performed on the second regions R21, R22, ..., and R26.

In the embodiment, exposure with at least three levels of exposure amount is performed in the exposure in one first region R1. That is, exposure with exposure amounts of levels different from one another is performed in the exposure on the plurality of second regions R2 in one first region R1.

When exposure is performed on the second regions R21, R22, and R23, exposure with exposure amounts of levels different from one another is performed, for example. As a specific example, when exposure is performed on the second region R21, the exposure of the mask pattern P2 is performed with the first exposure amount ds1; when exposure is performed on the second region R22, the exposure of the mask pattern P2 is performed with the second exposure amount ds2 larger than the first exposure amount ds1; and when exposure is performed on the second region R23, the exposure of the mask pattern P2 is performed with the third exposure amount ds3 larger than the second exposure amount ds2. Exposure may be performed with exposure amounts of levels different from one another for all the second regions R21 to R26, respectively.

In the embodiment, exposure is performed with the first exposure amount ds1 on the second regions R21 and R24, exposure is performed with the second exposure amount ds2 on the second regions R22 and R25, and exposure is performed with the third exposure amount ds3 on the second regions R23 and R26. Thus, exposure using the same mask pattern P2 is performed with the three levels of exposure amounts ds1, ds2, and ds3 in one first region R1.

To perform exposure using the exposure mask M2, a resist is applied onto the first surface 100a of the substrate 100, and then the exposure of the mask pattern P2 is performed with the exposure amounts described above on the plurality of second regions R2 using the exposure mask M2. After that, the resist is developed.

FIG. 11B shows an example of a pattern for estimation PT2 formed in one first region R1 after the development. As shown in FIG. 11B, in one first region R1, the pattern for estimation PT2 is formed in each of the plurality of second regions R2. The pattern for estimation PT2 is a resist pattern, for example. The pattern for estimation PT2 may be a pattern obtained by etching the substrate 100 using a resist pattern as a mask.

The pattern for estimation PT2 includes a plurality of patterns for estimation PT2a to PT2f. The pattern for estimation PT2a is formed in the second region R21. The pattern for estimation PT2b is formed in the second region R22. The pattern for estimation PT2c is formed in the second region R23. The three patterns for estimation PT2a, PT2b, and PT2c are formed with the exposure amounts ds1, ds2, and ds3 of levels different from one another, respectively. The dimensions of the three patterns for estimation PT2a, PT2b, and PT2c vary with the exposure amount. The dimensions of the pattern for estimation PT2 increase as the exposure amount increases, for example.

Similarly, the pattern for estimation PT2d is formed in the second region R24. The pattern for estimation PT2e is formed in the second region R25. The pattern for estimation PT2f is formed in the second region R26. The three patterns for estimation PT2d, PT2e, and PT2f are formed with the exposure amounts ds1, ds2, and ds3 of levels different from one another, respectively. The dimensions of the three patterns for estimation PT2d, PT2e, and PT2f vary with the exposure amount. The dimensions of the pattern for estimation PT2 increase as the exposure amount increases, for example.

Next, in the dimensional measurement of the pattern for estimation shown in step S203, the dimensions of the plurality of patterns for estimation PT2 formed in each of the plurality of first regions R1 on the substrate 100 are measured. In the acquisition of a relationship between the exposure condition and the dimension shown in step S204, a relationship between the exposure condition and the dimension is found for each of the plurality of first regions R1. In the selection of a region shown in step S205, a first region R1 suitable for the estimation of the exposure tolerance is selected from the plurality of first regions R1.

Figure 12A:
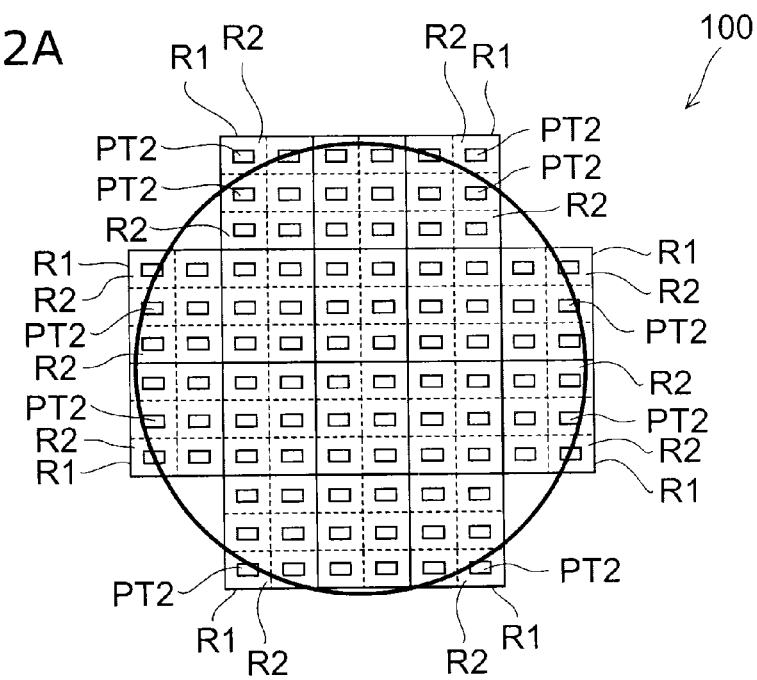
FIGS. 12A and 12B are schematic plan views illustrating the selection of a first region.
Figure 12B:
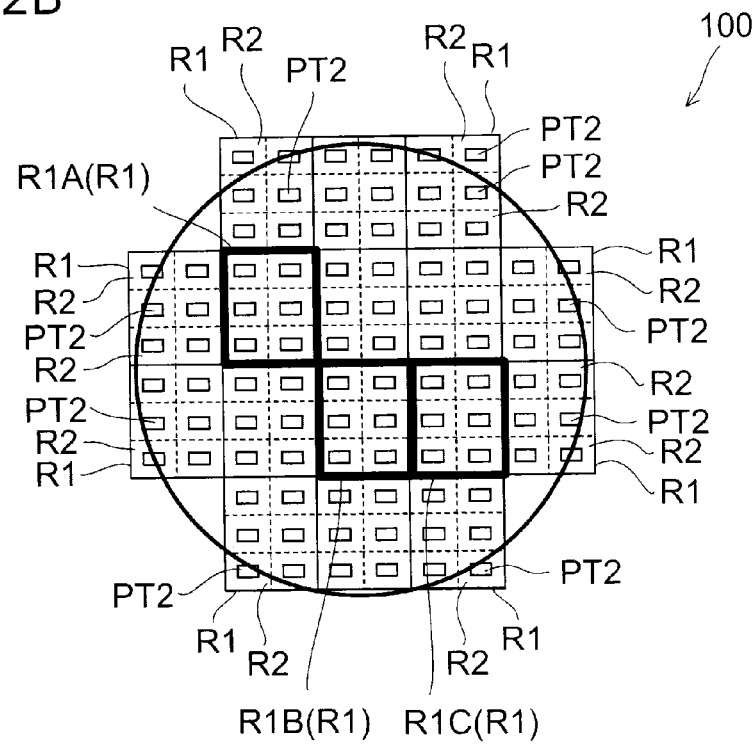

FIGS. 12A and 12B are schematic plan views illustrating the selection of a first region.

FIG. 12A shows a schematic plan view illustrating a state where the pattern for estimation PT2 is formed in each second region R2 of the substrate 100. FIG. 12B shows a selected first region R1. Although the pattern for estimation PT2 is shown also on the outside of the substrate 100 in FIGS. 12A and 12B for convenience of description, actually the pattern for estimation PT2 is not formed on the outside of the substrate 100.

As shown in FIG. 12A, the pattern for estimation PT2 is formed in each second region R2. The dimension of the pattern for estimation PT2 is measured for each of the plurality of first regions R1. In one first region R1, each of the plurality of patterns for estimation PT2 corresponds to one of the at least three levels of exposure amounts ds1, ds2, and ds3. Thus, a relationship between the exposure amount and the pattern dimension is obtained using the measured dimension as the pattern dimension.

In the embodiment, patterns for estimation PT2 based on the three levels of exposure amounts ds1, ds2, and ds3 are provided in two sets in one first region R1. Therefore, for one first region R1, the relationship between the exposure amount and the pattern dimension is obtained two in number. Thereby, further suppression of the in-plane variation is achieved.

Next, a first region R1 suitable for the estimation of the exposure tolerance is selected from the plurality of first regions R1. The method for selection is similar to that of the first embodiment. In the second embodiment, the second exposure amount ds2, which is an intermediate level out of the first exposure amount ds1, the second exposure amount ds2, and the third exposure amount ds3 of three levels, is taken as a reference. A first region R1 in which the pattern dimension of the pattern for estimation PT2 (PT2b and PT2e) formed with the second exposure amount ds2 falls within a previously set range AR is selected.

Here, for one first region R1, when the pattern dimension of either of the patterns for estimation PT2b and PT2e does not fall within the previously set range AR, the pattern for estimation is preferably excluded from the object to be selected. It is for the purpose of suppressing the variation in one shot.

In the example shown in FIG. 12B, three first regions R1A, R1B, and R1C are selected from the plurality of regions R. The three first regions R1A, R1B, and R1C have relationships between the exposure amount and the pattern dimension in which the pattern dimension of the pattern for estimation PT2 formed with the second exposure amount ds2 falls within the prescribed range AR with center at the target size Tgt.

Next, in the calculation of the exposure tolerance shown in step S206, the exposure tolerance is calculated from the relationship between the exposure condition and the pattern dimension for the selected first region R1. For example, the exposure tolerance is calculated from the relationships between the exposure amount and the pattern dimension of the three first regions R1A, R1B, and R1C previously selected. In the case where the number of selected first regions R1 is one, the exposure tolerance is calculated from the relationship between the exposure amount and the pattern dimension of the first region R1.

Figure 13A:
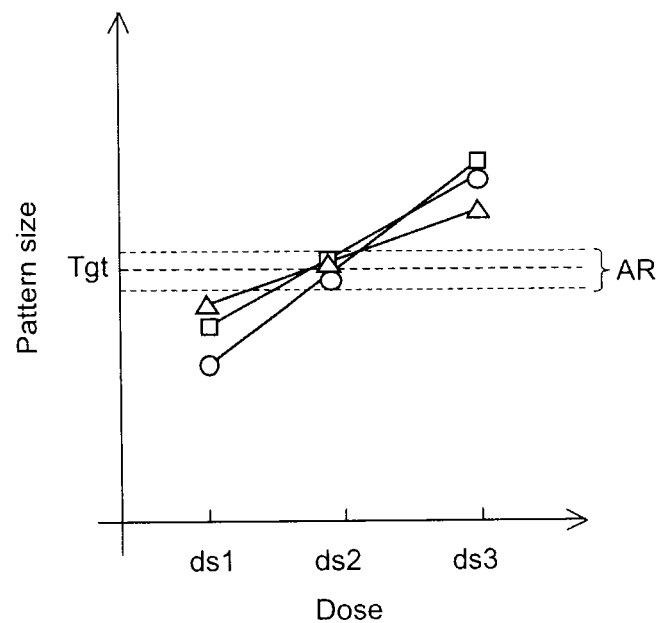
FIGS. 13A and 13B are diagrams illustrating the calculation of the exposure tolerance.
Figure 13B:
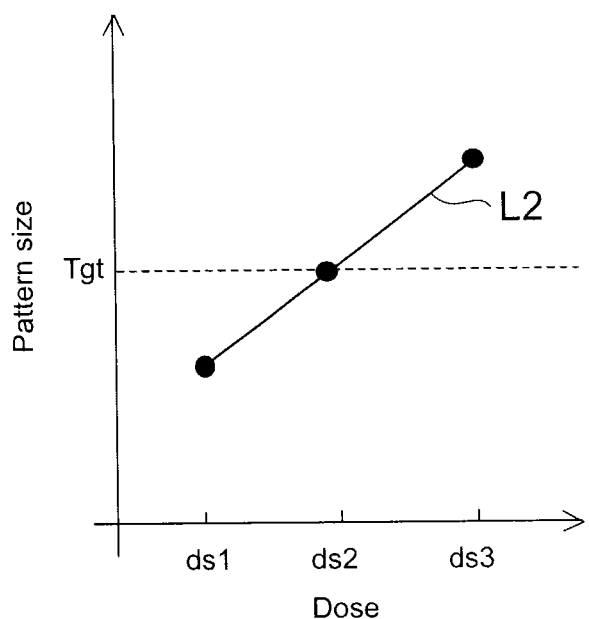

FIGS. 13A and 13B are diagrams illustrating the calculation of the exposure tolerance.

FIG. 13A shows the relationships between the exposure amount and the pattern dimension of the selected first regions R1A, R1B, and R1C. FIG. 13B shows the exposure tolerance calculated.

As shown in FIG. 13A, in the case where the plurality of first regions R1A, R1B, and R1C are selected, the relationships between the exposure amount and the pattern dimension of the regions are averaged. The exposure tolerance shown in FIG. 13B is obtained by averaging the relationships between the exposure amount and the pattern dimension of the three first regions R1A, R1B, and R1C shown in FIG. 13A. The method for averaging is similar to that of the first embodiment. A straight line L2 is found from the pattern dimensions obtained by the averaging. The exposure tolerance is obtained by the gradient of the straight line L2, for example.

In the exposure tolerance estimation method according to the embodiment described above, the reduction in reliability due to a variation in the plane of the substrate 100 of the dimensions of a pattern for estimation is suppressed. Furthermore, even when one mask pattern P2 is formed in one exposure mask M2 for convenience of design etc., estimation of the exposure tolerance in which the influence of the in-plane variation is suppressed is made by performing exposure using the mask pattern P2 on a plurality of second regions R2 in which the region of one shot is divided.

Third Embodiment

Figure 14:
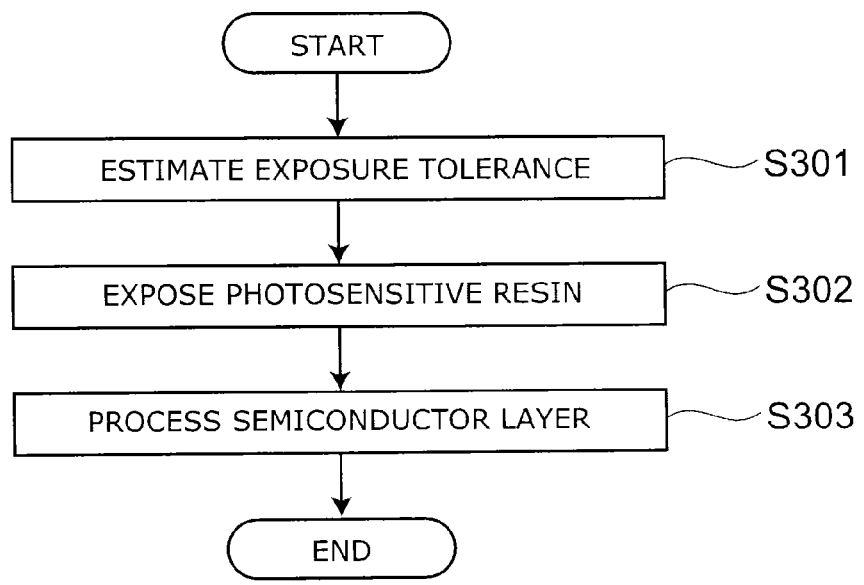
FIG. 14 is a flow chart illustrating a method for manufacturing a semiconductor device according to a third embodiment.

FIG. 14 is a flow chart illustrating a method for manufacturing a semiconductor device according to a third embodiment.

As shown in FIG. 14, the method for manufacturing a semiconductor device according to the third embodiment includes the estimation of the exposure tolerance (step S301), the exposure on a photosensitive resin (step S302), and the processing of a semiconductor layer (step S303).

The estimation of the exposure tolerance shown in step S301 uses one of the first embodiment and the second embodiment described above. In the exposure on a photosensitive resin shown in step S302, a photosensitive resin (resist) is applied onto a semiconductor layer, and exposure is performed on the resist using an exposure condition suitable for the target size on the basis of the exposure tolerance obtained in step S301. In the etching of a semiconductor layer shown in step S303, the resist is developed, and prescribed processing is performed on the semiconductor layer using the resist after development (a resist pattern) as a mask. The prescribed processing is etching, ion implantation, film formation, etc. A semiconductor device is completed through such processes.

In the embodiment, since the exposure tolerance is estimated accurately, a pattern with high dimensional accuracy is obtained by an appropriate exposure condition when the exposure on the resist is performed. Thus, the reliability and the yield of the semiconductor device are improved.

Fourth Embodiment

Figure 15:
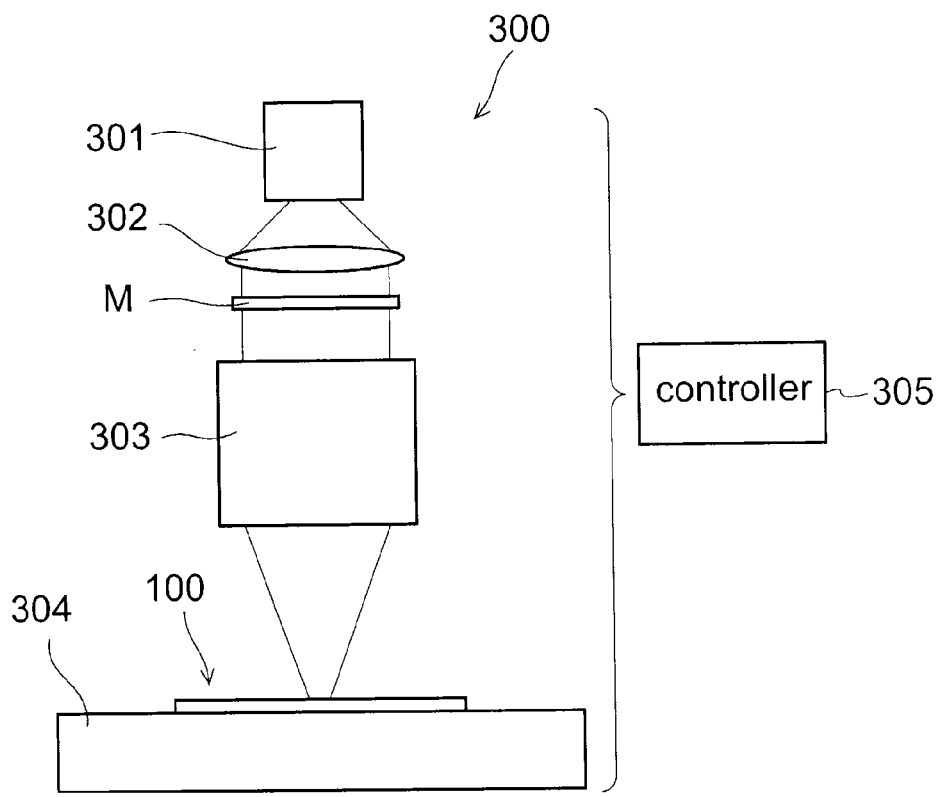
FIG. 15 is a schematic view illustrating an exposure apparatus according to a fourth embodiment.

FIG. 15 is a schematic view illustrating an exposure apparatus according to a fourth embodiment.

As shown in FIG. 15, an exposure apparatus 300 according to the fourth embodiment includes a light source 301, a first lens 302, a second lens 303, a stage 304, and a control unit 305. The light source 301 emits exposure light. The first lens 302 converts the exposure light emitted from the light source 301 to a parallel light beam. An exposure mask M is disposed between the first lens 302 and the second lens 303. The second lens 303 condenses the exposure light transmitted via the exposure mask M. The substrate 100 is mounted on the stage 304. The exposure light condensed via the second lens 303 is applied onto the substrate 100. The stage 304 moves the substrate 100 in the X direction, the Y direction, and the e direction (rotation direction), for example. The control unit 305 controls the light source 301 and the stage 304.

The exposure tolerance estimation method according to the first embodiment and the second embodiment may be incorporated as a function of the exposure apparatus 300. The exposure apparatus 300 has a mode for estimating the tolerance of the exposure amount as the exposure condition (estimation mode), for example. When the mode is performed, the processing of part of the exposure tolerance estimation method according to one of the first embodiment and the second embodiment is performed by the control of the control unit 305.

When the estimation mode corresponding to the exposure tolerance estimation method according to the first embodiment is performed, the control unit 305 controls the setting of a region of step S101 shown in FIG. 1 and exposure using the exposure mask M1 out of the formation of a pattern for estimation of step S102 (exposure using at least three levels of exposure condition in one shot), for example. When the estimation mode corresponding to the exposure tolerance estimation method according to the second embodiment is performed, the control unit 305 controls the setting of a first region and a second region of step S101 shown in FIG. 8 and exposure using the exposure mask M2 out of the formation of a pattern for estimation of step S202 (exposure using at least three levels of exposure condition in the first region R1), for example.

The exposure apparatus 300 is used when the exposure on a photosensitive resin (step S302) is performed in the method for manufacturing a semiconductor device according to the third embodiment. The control unit 305 acquires the estimation of the exposure tolerance from a not-shown memory device (data base etc.) when the exposure on a photosensitive resin is performed in the method for manufacturing a semiconductor device. The light source 301 is controlled so as to obtain an appropriate exposure condition based on the results of the exposure tolerance estimation.

Fifth Embodiment

Of the exposure tolerance estimation method according to the first embodiment described above, the acquisition of a relationship between the exposure condition and the dimension shown in FIG. 1 (step S104), the selection of a region (step S105), and the calculation flow path of the exposure tolerance (step S106) may be performed as a program (exposure tolerance estimation program) executed by a computer.

Of the exposure tolerance estimation method according to the second embodiment, the acquisition of a relationship between the exposure condition and the dimension shown in FIG. 8 (step S204), the selection of a first region (step S205), and the calculation of the exposure tolerance (step S206) may be performed as a program (exposure tolerance estimation program) executed by a computer. The exposure tolerance estimation program may be distributed via a network.

Figure 16:
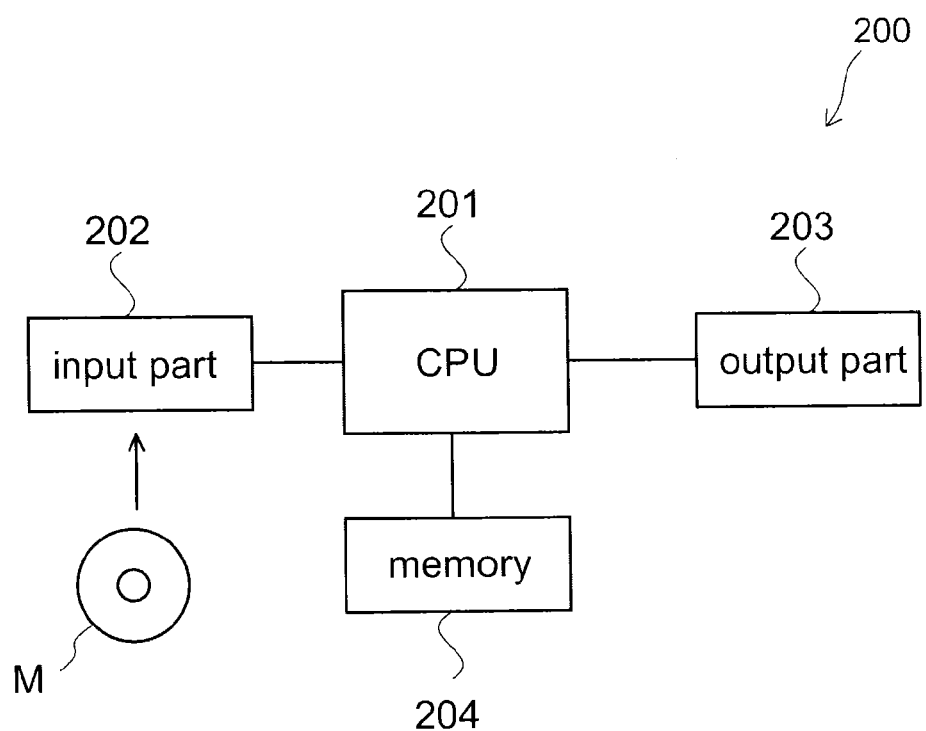
FIG. 16 is a diagram illustrating a hardware configuration of a computer.

FIG. 16 is a diagram illustrating a hardware configuration of a computer.

A computer 200 includes a central processing unit 201, an input part 202, an output part 203, and a memory unit 204. The input part 202 includes a function of reading information recorded in a recording medium M. The flow path design program is executed by the central processing unit 201.

Sixth Embodiment

The exposure tolerance estimation program may be recorded in a computer-readable recording medium. The recording medium M stores the acquisition of a relationship between the exposure condition and the dimension shown in FIG. 1 (step S104), the selection of a region (step S105), and the calculation flow path of the exposure tolerance (step S106) in the computer 200 in a readable format.

Furthermore, the recording medium M stores the acquisition of a relationship between the exposure condition and the dimension shown in FIG. 8 (step S204), the selection of a first region (step S205), and the calculation of the exposure tolerance (step S206) in the computer 200 in a readable format. The recording medium M may be a memory device such as a server connected to a network.

As described above, the embodiment can provide an exposure tolerance estimation method with high reliability and a method for manufacturing a semiconductor device with high reliability.

Hereinabove, embodiments and modification examples thereof are described. However, the invention is not limited to these examples. For example, although the embodiments mentioned above are described using the exposure amount as an example of the exposure condition, exposure conditions other than the exposure amount may be used. For example, the focus position in exposure may be used as the exposure condition. Furthermore, one skilled in the art may appropriately make additions, removals, and design modifications of components to the embodiments or the modification examples described above, and may appropriately combine features of the embodiments; such modifications also are included in the scope of the invention to the extent that the spirit of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An exposure tolerance estimation method comprising:
   setting a plurality of regions along a first surface of a substrate;
   forming a plurality of patterns for estimation by performing exposure on each of the regions using at least three levels of exposure condition using an exposure mask provided with a plurality of mask patterns having a same dimension;
   measuring dimensions of the patterns for estimation formed in the each of the regions;
   finding relationships between the exposure condition and the dimensions for the each of the regions;
   selecting a first region from the regions, in the first region a first dimension of a first pattern for estimation formed by exposure using a first exposure condition of an intermediate level out of the at least three levels falling within a previously set range; and
   calculating an exposure tolerance from a relationship between the first exposure condition and the first dimension for the first selected region.

2. The method according to claim 1, wherein the forming the patterns for estimation includes performing exposure using the at least three levels of exposure condition by one exposure processing.

3. The method according to claim 1, wherein the forming the patterns for estimation includes equalizing image heights of the patterns for estimation in exposure using the mask patterns.

4. The method according to claim 1, wherein in a case where the first region is selected in a plurality in the selecting the first region, the calculating the exposure tolerance includes averaging relationships between the first exposure condition and the first dimension for each of the first regions.

5. The method according to claim 1, wherein the forming the patterns for estimation includes setting a rectangular light irradiation region on the exposure mask, the rectangular light irradiation region extending in a first direction in which the mask patterns are aligned, and changing an exposure amount to the light irradiation region in the first direction.

6. The method according to claim 5, wherein the forming the patterns for estimation includes scanning the light irradiation region in a second direction orthogonal to the first direction.

7. The method according to claim 1, wherein the patterns for estimation are formed on a resist.

8. The method according to claim 1, wherein the exposure condition is an exposure amount.

9. The method according to claim 1, wherein the exposure condition is a focus position of exposure.

10. An exposure tolerance estimation method comprising:
setting a plurality of first regions along a first surface of a substrate and a plurality of second regions provided in each of the first regions;
performing exposure on each of the second regions using an exposure mask provided with a mask pattern and forming a plurality of patterns for estimation using at least three levels of exposure condition in each of the first regions;
measuring dimensions of the patterns for estimation formed in the each of the first regions;
finding relationships between the exposure condition and the dimensions for the each of the first regions;
selecting a third region from the first regions, in the third region a first dimension of a first pattern for estimation formed by exposure using a first exposure condition of an intermediate level out of the at least three levels falling within a previously set range; and
calculating an exposure tolerance from a relationship between the first exposure condition and the first dimension for the selected third region.

11. The method according to claim 10, wherein the patterns for estimation are formed on a resist.

12. The method according to claim 10, wherein the exposure condition is an exposure amount.

13. The method according to claim 10, wherein the exposure condition is a focus position in exposure.

14. A method for manufacturing a semiconductor device comprising:
setting a plurality of regions along a first surface of a substrate;
forming a plurality of patterns for estimation by performing exposure on each of the regions using at least three levels of exposure condition using an exposure mask provided with a plurality of mask patterns having the same dimension;
measuring dimensions of the patterns for estimation formed in the each of the plurality of regions;
finding relationships between the exposure condition and the dimensions for the each of the regions;
selecting a first region from the regions, in the first region a first dimension of a first pattern for estimation formed by exposure using a first exposure condition of an intermediate level out of the at least three levels being nearest to a previously set target value;
calculating an exposure tolerance from a relationship between the first exposure condition and the first dimension for the selected first region;
applying a photosensitive resin on a semiconductor layer and performing exposure on the photosensitive resin using a second exposure condition obtained from the exposure tolerance; and
developing the photosensitive resin and performing processing on the semiconductor layer using the photosensitive resin after development as a mask.

15. The method according to claim 14, wherein the forming the patterns for estimation includes performing exposure using the at least three levels of exposure condition by one exposure processing.

16. The method according to claim 14, wherein the forming the patterns for estimation includes equalizing image heights of the patterns for estimation in exposure using the mask patterns.

17. The method according to claim 14, wherein in a case where the first region is selected in a plurality in the selecting the first region, the calculating the exposure tolerance includes averaging relationships between the first exposure condition and the first dimension for each of the first regions.

18. The method according to claim 14, wherein the forming the patterns for estimation includes setting a rectangular light irradiation region on the exposure mask, the rectangular light irradiation region extending in a first direction in which the mask patterns are aligned, and changing an exposure amount to the light irradiation region in the first direction.

19. The method according to claim 18, wherein the forming the patterns for estimation includes scanning the light irradiation region in a second direction orthogonal to the first direction.

20. The method according to claim 14, wherein the exposure condition is an exposure amount.

* * * * *